US009269782B2

(12) United States Patent
Kanamura et al.

(10) Patent No.: US 9,269,782 B2
(45) Date of Patent: Feb. 23, 2016

(54) SEMICONDUCTOR DEVICE

(75) Inventors: Masahito Kanamura, Isehara (JP);
Toyoo Miyajima, Isehara (JP);
Toshihiro Ohki, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 100 days.

(21) Appl. No.: 13/606,542

(22) Filed: Sep. 7, 2012

(65) Prior Publication Data

US 2013/0075789 A1 Mar. 28, 2013

(30) Foreign Application Priority Data

Sep. 27, 2011 (JP) .................................. 2011-211561

(51) Int. Cl.
| | | |
|---|---|---|
| H01L 29/423 | (2006.01) | |
| H01L 29/66 | (2006.01) | |
| H01L 29/778 | (2006.01) | |
| H01L 29/20 | (2006.01) | |
| H03F 1/32 | (2006.01) | |
| H01L 21/28 | (2006.01) | |

(52) U.S. Cl.
CPC .... *H01L 29/42364* (2013.01); *H01L 21/28264* (2013.01); *H01L 29/2003* (2013.01); *H01L 29/66462* (2013.01); *H01L 29/7787* (2013.01); *H03F 1/3247* (2013.01)

(58) Field of Classification Search
CPC . H01L 29/778; H01L 29/24; H01L 29/42364; H01L 29/28264; H01L 29/7787; H01L 29/3247
USPC ..................................... 257/194, 43; 438/104
See application file for complete search history.

(56) References Cited

U.S. PATENT DOCUMENTS

| | | | | |
|---|---|---|---|---|
| 6,903,383 | B2 * | 6/2005 | Yokogawa et al. | ........... 257/192 |
| 8,125,004 | B2 | 2/2012 | Kaneko | |
| 8,304,809 | B2 * | 11/2012 | Kaya et al. | ..................... 257/192 |
| 2003/0203604 | A1 * | 10/2003 | Makita | ........................... 438/571 |
| 2006/0157729 | A1 | 7/2006 | Ueno | |
| 2007/0018210 | A1 | 1/2007 | Sheppard | |
| 2009/0057720 | A1 | 3/2009 | Kaneko | |
| 2009/0194791 | A1 * | 8/2009 | Kanamura | ..................... 257/192 |

(Continued)

FOREIGN PATENT DOCUMENTS

| | | | |
|---|---|---|---|
| JP | 2002-359256 | A1 | 12/2002 |
| JP | 2006-222414 | | 8/2006 |

(Continued)

OTHER PUBLICATIONS

Taiwanese Office Action dated Sep. 10, 2014. TW patent application No. 101132714.

(Continued)

*Primary Examiner* — Evan Pert
*Assistant Examiner* — Damon Hillman
(74) *Attorney, Agent, or Firm* — Kratz, Quintos & Hanson, LLP

(57) ABSTRACT

A semiconductor device, comprising: a first semiconductor layer disposed on a substrate; a second semiconductor layer disposed on the first semiconductor layer; a lower insulating film disposed on the second semiconductor layer; a p-type electroconductive oxide film disposed on the lower insulating film; an upper insulating film disposed on the oxide film; and a gate electrode disposed on the upper insulating film, wherein the lower insulating film under the gate electrode has a depressed portion.

18 Claims, 20 Drawing Sheets

(56) References Cited

U.S. PATENT DOCUMENTS

2010/0044752 A1  2/2010  Marui
2010/0155720 A1* 6/2010  Kaneko ........................ 257/43
2010/0155780 A1  6/2010  Machida et al.

FOREIGN PATENT DOCUMENTS

| JP | 2010-153493 | | 7/2010 |
| JP | 2010147387 | A | 7/2010 |
| JP | 2010-199481 | A1 | 9/2010 |
| JP | 2010-232610 | A | 10/2010 |

OTHER PUBLICATIONS

Office Action of Chinese Patent Application No. 201210353412.4 dated Nov. 25, 2014 with whole translated Office Action.
Office Action of Japanese Patent Application No. 2011-211561 dated Mar. 17, 2015 with Partial Translation.
Notice of Preliminary Rejection mailed Aug. 7, 2013 from the Korean Intellectual Property Office in counterpart application No. 10-2012-105078 with English translation.
Office Action of Chinese Patent Application No. 201210353412.4 dated Jul. 23, 2015 with English Translation.

* cited by examiner

SEMICONDUCTOR DEVICE

CROSS-REFERENCE TO RELATED APPLICATION(S)

This application is based upon and claims the benefit of priority of the prior Japanese Patent Application No. 2011-211561, filed on Sep. 27, 2011, the entire contents of which are incorporated herein by reference.

FIELD

The embodiments discussed herein are related to semiconductor devices and methods for manufacturing semiconductor devices.

BACKGROUND

Nitride semiconductors GaN, AlN, and InN and mixed crystals thereof have a wide band gap and have been used in high-power electronic devices and short-wavelength light-emitting devices. Regarding high-power devices, various technologies related to field-effect transistors (FETs), in particular, high-electron-mobility transistors (HEMTs) have been developed.

HEMTs manufactured using such nitride semiconductors have been used in high-power high-efficiency amplifiers and high-power switching devices.

HEMTs manufactured using such nitride semiconductors have an aluminum gallium nitride/gallium nitride (AlGaN/GaN) heterostructure on a substrate and include a GaN layer as an electron transit layer.

The substrate may be made of sapphire, silicon carbide (SiC), gallium nitride (GaN), or silicon (Si).

GaN has a band gap of 3.4 eV, which is higher than the band gap of Si (1.1 eV) or GaAs (1.4 eV), and has a high breakdown voltage. GaN has a high saturated electron velocity and allows high-voltage and high-power operation. Thus, GaN may be used in high-voltage devices for high-efficiency switching devices and electric vehicles. In order to reduce a leakage current in transistors, a device having an insulated gate structure that includes an insulating film under a gate electrode is disclosed.

[Patent document] Japanese Laid-open Patent Publication No. 2002-359256
[Patent document] Japanese Laid-open Patent Publication No. 2010-199481

It is desirable that power switching devices be capable of normally-off operation, during which no electric current flows through a semiconductor device unless a gate voltage is applied. Normally-off operation involves a shift of the gate threshold voltage in the positive direction. Thus, structures including a p-GaN cap layer or a gate recess have been investigated.

However, a structure including a p-GaN cap layer has a problem that crystals are difficult to grow. A structure including a gate recess has a problem that it is easily damaged by etching and that it is difficult to control the depth of the gate recess.

In an insulated gate structure that has an insulating film under a gate electrode to reduce gate leakage current, the insulating film between a semiconductor layer and the gate electrode blocks an electron channel and shifts the gate threshold voltage in a negative direction. It is therefore difficult to perform normally-off operation.

The formation of a p-type NiO film on a semiconductor layer as an insulating film under a gate electrode has been studied to realize normally-off operation and reduced gate leakage current. However, NiO has a narrower band gap than $SiO_2$ or $Al_2O_3$ and insufficiently reduces gate leakage current.

SUMMARY

According to an aspect of the embodiments, a semiconductor device includes a first semiconductor layer disposed on a substrate; a second semiconductor layer disposed on the first semiconductor layer; a lower insulating film disposed on the second semiconductor layer; a p-type electroconductive oxide film disposed on the lower insulating film; an upper insulating film disposed on the oxide film; and a gate electrode disposed on the upper insulating film, wherein the lower insulating film under the gate electrode has a depressed portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1A:
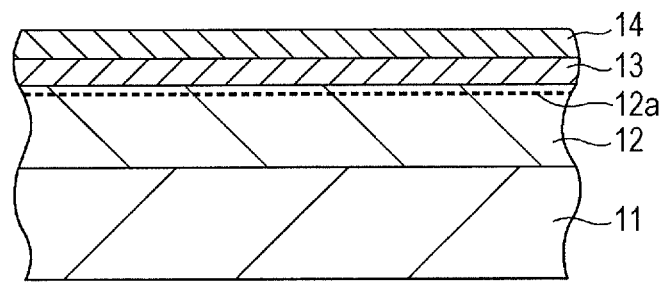
FIGS. 1A to 1C are process drawings (1) of a method for manufacturing a semiconductor device according to a first embodiment.

Embodiments will be described below. Like parts are designated by like reference numerals and will not be further described.

First Embodiment

Semiconductor Device and Method for Manufacturing Semiconductor Device

A method for manufacturing a semiconductor device according to a first embodiment will be described below with reference to FIGS. 1A to 3B.

As illustrated in FIG. 1A, a buffer layer (not shown), an electron transit layer 12, an electron supply layer 13, and a cap layer 14 are sequentially epitaxially grown as semiconductor layers on a substrate 11 by metal-organic vapor phase epitaxy (MOVPE).

The substrate 11 may be made of Si, sapphire, SiC, GaN, or AlN.

The electron transit layer 12 is a first semiconductor layer made of intentionally undoped GaN having a thickness of 3 µm.

The electron supply layer 13 is a second semiconductor layer made of intentionally undoped $Al_{0.25}Ga_{0.75}N$ having a thickness of 20 nm. The electron supply layer 13 may be of an n type partly doped with an impurity element, such as Si.

The cap layer 14 is a third semiconductor layer and is made of n-GaN doped with an impurity element, such as Si. The cap layer 14 stabilizes the surface of the semiconductor layers and may be an intentionally undoped GaN (i-GaN) or may have a multilayer cap structure of $Al_xGa_{1-x}N$ (the Al ratio x is different from that of AlGaN in the electron supply layer 13). The cap layer 14 may be omitted. 2DEG 12a is formed in the electron transit layer 12 adjacent to the electron supply layer 13.

In the MOVPE in the present embodiment, the raw material gases are trimethylgallium (TMG) for Ga, trimethylaluminum (TMA) for Al, ammonia ($NH_3$) for N, and monosilane ($SiH_3$) for Si. These raw material gases are supplied to a reaction furnace of an MOVPE apparatus with a hydrogen ($H_2$) carrier gas.

Figure 1B:
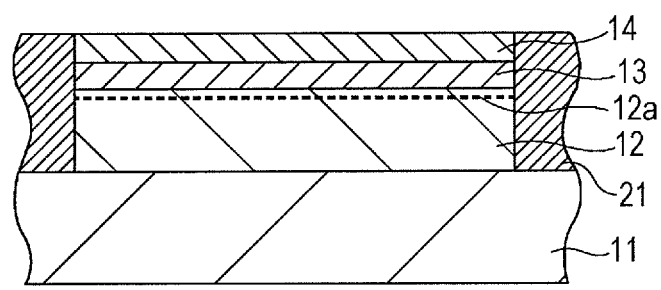

As illustrated in FIG. 1B, a device isolation region 21 is formed in the semiconductor layers. More specifically, a photoresist is applied to the cap layer 14, is exposed to light from an exposure apparatus, and is developed to form a resist pattern (not shown) having an opening corresponding to the device isolation region 21. The device isolation region 21 is formed by subsequent dry etching with a chlorine gas or ion implantation. After the device isolation region 21 is formed, the resist pattern is removed with an organic solvent.

Figure 1C:
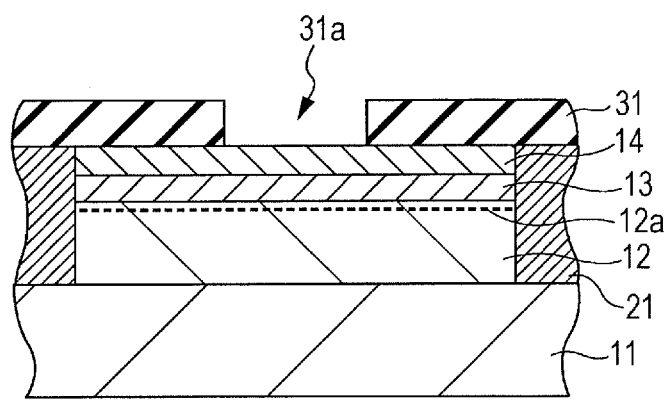

As illustrated in FIG. 1C, a first insulating film 31 having an opening 31a is formed. The first insulating film 31 is made of an insulating oxide or nitride, such as a material containing one or two or more selected from the group consisting of $Al_2O_3$, SiN, $SiO_2$, $HfO_2$, $Ta_2O_5$, $ZrO_2$, and MgO. In the present embodiment, the first insulating film 31 is an $Al_2O_3$ film formed by atomic layer deposition (ALD). In ALD, the raw materials are TMA for Al and water, oxygen plasma, or ozone for oxygen. The first insulating film 31 is preferably formed at a temperature in the range of 200° C. to 600° C. After the first insulating film 31 is formed, a photoresist is applied to the first insulating film 31, is exposed to light from an exposure apparatus, and is developed to form a resist pattern (not shown) having an opening under a region for forming a gate electrode 41 described below. A portion of the first insulating film 31 exposed through the opening of the resist pattern is removed by wet etching to form an opening 31a. Thus, the opening 31a in the first insulating film 31 is disposed under the region for forming the gate electrode 41. The resist pattern (not shown) is then removed with an organic solvent. The removal of the first insulating film 31 by wet etching causes little damage to the cap layer 14.

Figure 2A:
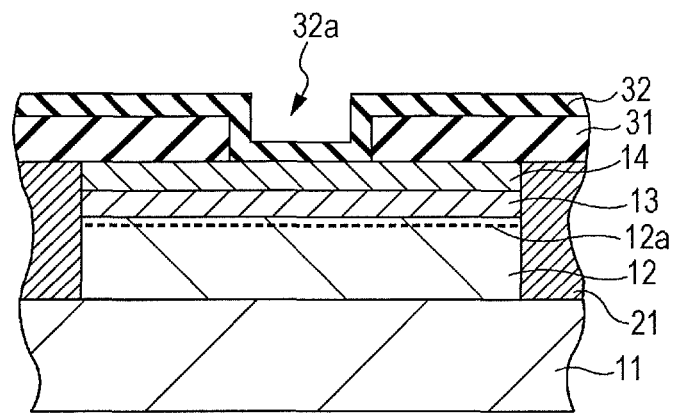
FIGS. 2A to 2C are process drawings (2) of the method for manufacturing the semiconductor device according to the first embodiment.

As illustrated in FIG. 2A, a second insulating film 32 is formed on the first insulating film 31 and the cap layer 14. The second insulating film 32 is made of an insulating oxide or nitride, such as a material containing one or two or more selected from the group consisting of $Al_2O_3$, SiN, $SiO_2$, $HfO_2$, $Ta_2O_5$, $ZrO_2$, and MgO. In the present embodiment, the second insulating film 32 is an $Al_2O_3$ film formed by ALD. In ALD, the raw materials are TMA for Al and water, oxygen plasma, or ozone for oxygen. The second insulating film 32 is preferably formed at a temperature in the range of 200° C. to 600° C.

The formation of the first insulating film 31 and the second insulating film 32 may be followed by heat treatment preferably at a temperature in the range of 350° C. to 1000° C. The first insulating film 31 and the second insulating film 32 may also be formed by plasma chemical vapor deposition (CVD) or sputtering. In the present embodiment, the first insulating film 31 and the second insulating film 32 may also be referred to as a lower insulating film. Thus, a depressed portion 32a is formed on the lower insulating film composed of the first insulating film 31 and the second insulating film 32 under the region for forming the gate electrode 41.

Figure 2B:
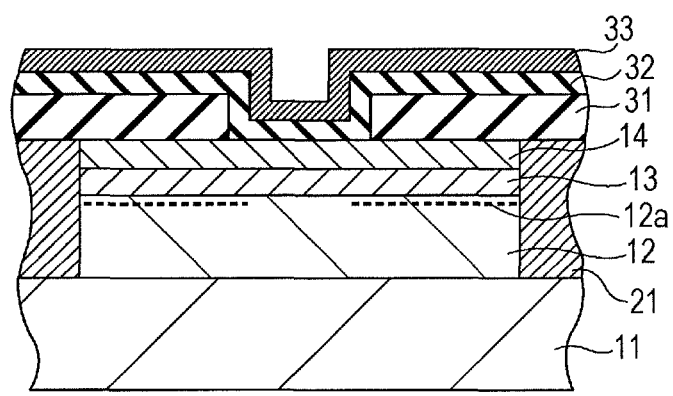

As illustrated in FIG. 2B, an oxide film 33 is formed on the second insulating film 32. The oxide film 33 is made of a p-type electroconductive oxide, or more specifically, a material containing one or two or more selected from the group consisting of NiO, $Cu_2O$, $CuAlO_2$, $Ga_2O_3$, and $CuGaO_2$. Although these oxides have p-type electrical conductivity without an impurity element, these oxides may be doped with a p-type impurity element to produce better effects. The oxide film 33 is a NiO layer having a thickness of 40 nm formed by sputtering. The oxide film 33 may also be formed by vacuum evaporation. The oxide film 33 may be heat-treated at a temperature in the range of 300° C. to 1000° C. in an oxygen or nitrogen atmosphere.

Figure 2C:
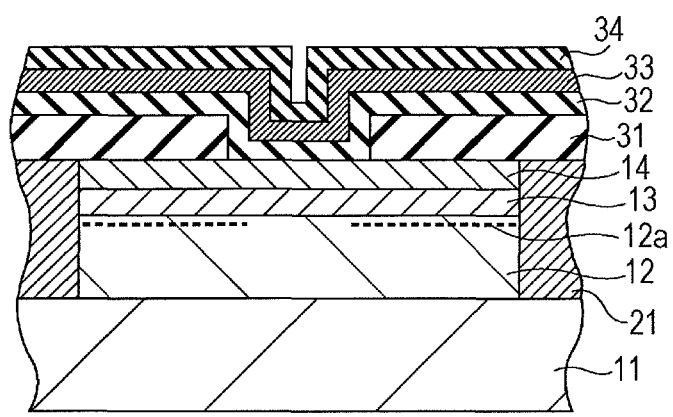

As illustrated in FIG. 2C, a third insulating film 34 is formed on the oxide film 33. The third insulating film 34 is made of an insulating nitrogen-containing material, or more specifically, a nitride, such as SiN or AlN, or an oxynitride, such as SiON or AlON. In the present embodiment, the third insulating film 34 is a SiN film having a thickness of 5 nm formed by plasma CVD. It is noted that the third insulating film 34 contains nitrogen. An experiment performed by the present inventor demonstrated that the third insulating film 34 made of $SiO_2$ or $Al_2O_3$ free of a nitrogen component did not have improved electrical characteristics, but the third insulating film 34 containing a nitrogen component improved the electrical characteristics of the semiconductor device. This experiment indicates that the third insulating film 34 is preferably made of an insulating nitrogen-containing material. The third insulating film 34 may also be referred to as an upper insulating film.

Figure 3A:
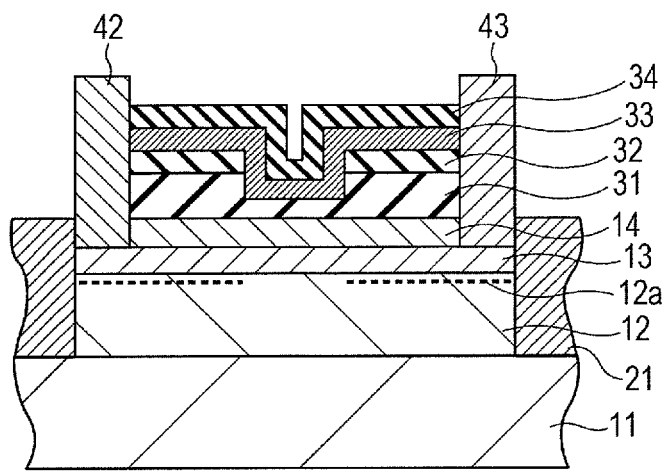
FIGS. 3A and 3B are process drawings (3) of the method for manufacturing the semiconductor device according to the first embodiment.

As illustrated in FIG. 3A, a source electrode 42 and a drain electrode 43 are formed in contact with the semiconductor layers. More specifically, a photoresist is applied to the third insulating film 34, is exposed to light from an exposure apparatus, and is developed to form a resist pattern (not shown) having openings corresponding to the source electrode 42 and the drain electrode 43. The third insulating film 34, the oxide film 33, the second insulating film 32, the first insulating film 31, and the cap layer 14 are partly removed by dry etching, such as reactive ion etching (RIE) with a gas containing a chlorine component, to expose the electron supply layer 13. After the resist pattern is removed, a photoresist is again applied to the third insulating film 34, is exposed to light from an exposure apparatus, and is developed to form a resist pattern (not shown) having openings corresponding to the source electrode 42 and the drain electrode 43. A Ta/Al/Ta layered metal film is then formed by vacuum evaporation and is immersed in an organic solvent to lift-off the metal film on the resist pattern. Thus, the source electrode 42 and the drain electrode 43 made of Ta/Al/Ta are formed on the electron supply layer 13 in a region not coated with the resist. The source electrode 42 and the drain electrode 43 are then heat-treated at a temperature of 600° C. or less for ohmic contact.

Figure 3B:
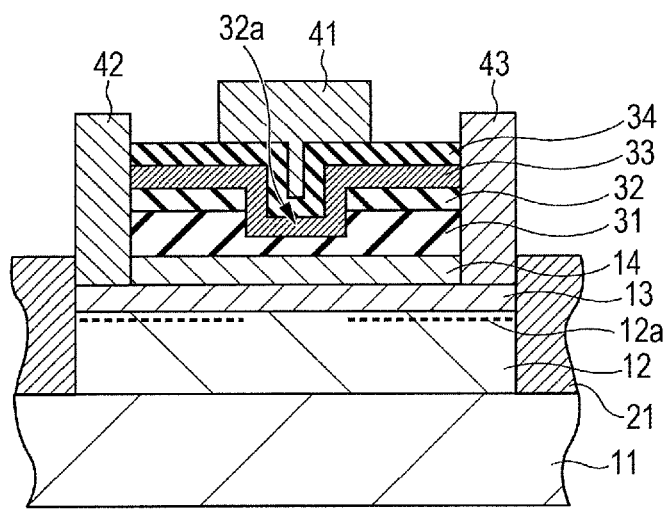

As illustrated in FIG. 3B, the gate electrode 41 is formed on the third insulating film 34. More specifically, a photoresist is applied to the third insulating film 34, is exposed to light from an exposure apparatus, and is developed to form a resist pattern (not shown) having an opening corresponding to the gate electrode 41. The resist pattern is formed such that the opening 31a of the first insulating film 31 and the depressed portion 32a of the second insulating film 32 are disposed under the opening of the resist pattern. A Ni/Au layered metal film is then formed by vacuum evaporation and is immersed in an organic solvent to lift-off the metal film on the resist pattern. Thus, the gate electrode 41 made of Ni/Au is formed on the third insulating film 34 in a predetermined region not coated with the resist. The opening 31a of the first insulating film 31 and the depressed portion 32a of the second insulating film 32 are disposed under the gate electrode 41 with the third insulating film 34 and the oxide film 33 interposed therebetween. The term "under the gate electrode 41", as used herein, includes a region under the third insulating film 34 or a region under the third insulating film 34, the oxide film 33, the second insulating film 32, the cap layer 14, and the electron supply layer 13.

In this way, the semiconductor device according to the present embodiment may be manufactured. The present embodiment does not include a process of exposing the semiconductor layers, such as the cap layer 14, to plasma by dry etching and may therefore stably manufacture a semiconductor device having desired characteristics in high yield.

In the semiconductor device illustrated in FIG. 3B, the p-type electroconductive oxide film 33 is close to the electron transit layer 12 under the gate electrode 41 and may reduce electrons of the 2DEG 12a under the gate electrode 41. This may cause normally-off operation. The second insulating film 32 between the oxide film 33 and the cap layer 14 and the third insulating film 34 containing a nitrogen component between the oxide film 33 and the gate electrode 41 may reduce gate leakage current, protect the oxide film, and reduce the electron trapping level.

EXAMPLES

The characteristics of the semiconductor device according to the present embodiment are compared with those of semiconductor devices having a traditional structure according to Comparative Examples 1 to 3. A semiconductor device described in Example 1 is the semiconductor device according to the present embodiment and is manufactured by the method described above.

Comparative Example 1

Figure 4:
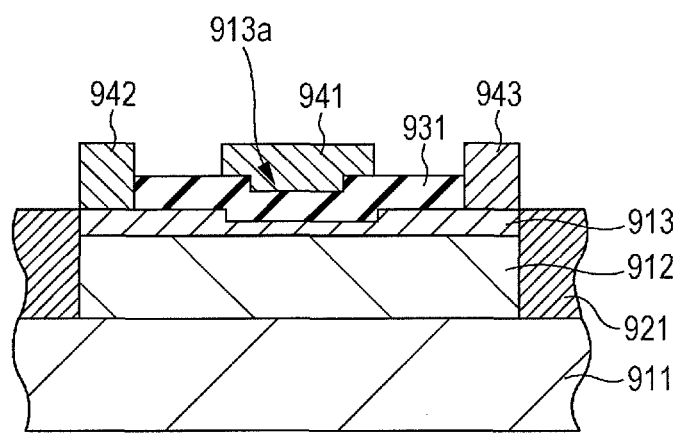
FIG. 4 is a structural drawing of a semiconductor device according to Comparative Example 1.

As illustrated in FIG. 4, a semiconductor device according to Comparative Example 1 is a HEMT having a gate recess. The semiconductor device according to Comparative Example 1 is manufactured by the following method.

First, an electron transit layer 912 and an electron supply layer 913 are sequentially formed as semiconductor layers on a substrate 911 by MOVPE. The electron transit layer 912 is an intentionally undoped GaN layer having a thickness of approximately 3 μm. The electron supply layer 913 is an intentionally undoped $Al_{0.25}Ga_{0.75}N$ layer having a thickness of approximately 20 nm. A resist pattern having an opening corresponding to a device isolation region 921 is formed on the electron supply layer 913. The device isolation region 921 is formed on the semiconductor layer by subsequent dry etching with a gas containing a chlorine component or ion implantation.

A resist pattern having openings corresponding to a source electrode 942 and a drain electrode 943 is formed on the electron supply layer 913. A Ti/Al layered metal film is then formed, and the metal film on the resist pattern is removed by lift-off to form the source electrode 942 and the drain electrode 943 on the electron supply layer 913. The source electrode 942 and the drain electrode 943 are then heat-treated at a temperature of approximately 700° C. for ohmic contact.

A resist pattern having an opening corresponding to a gate recess 913a is formed on the electron supply layer 913. A region of the electron supply layer 913 not coated with the resist is removed by dry etching, such as RIE, to form the gate recess 913a in the electron supply layer 913. After the resist pattern is removed, an insulating film 931 made of $Al_2O_3$, which serves as a gate-insulating film, is formed on the electron supply layer 913 by plasma CVD. A resist pattern having an opening corresponding to the gate recess 913a is formed on the insulating film 931. A Ni/Au layered metal film is then formed on top of the insulating film 931. The metal film on the resist pattern is removed by lift-off to form a gate electrode 941 on the gate recess 913a.

A semiconductor device HEMT according to Comparative Example 1 is manufactured through these processes.

Comparison with Comparative Example 1

Figure 5:
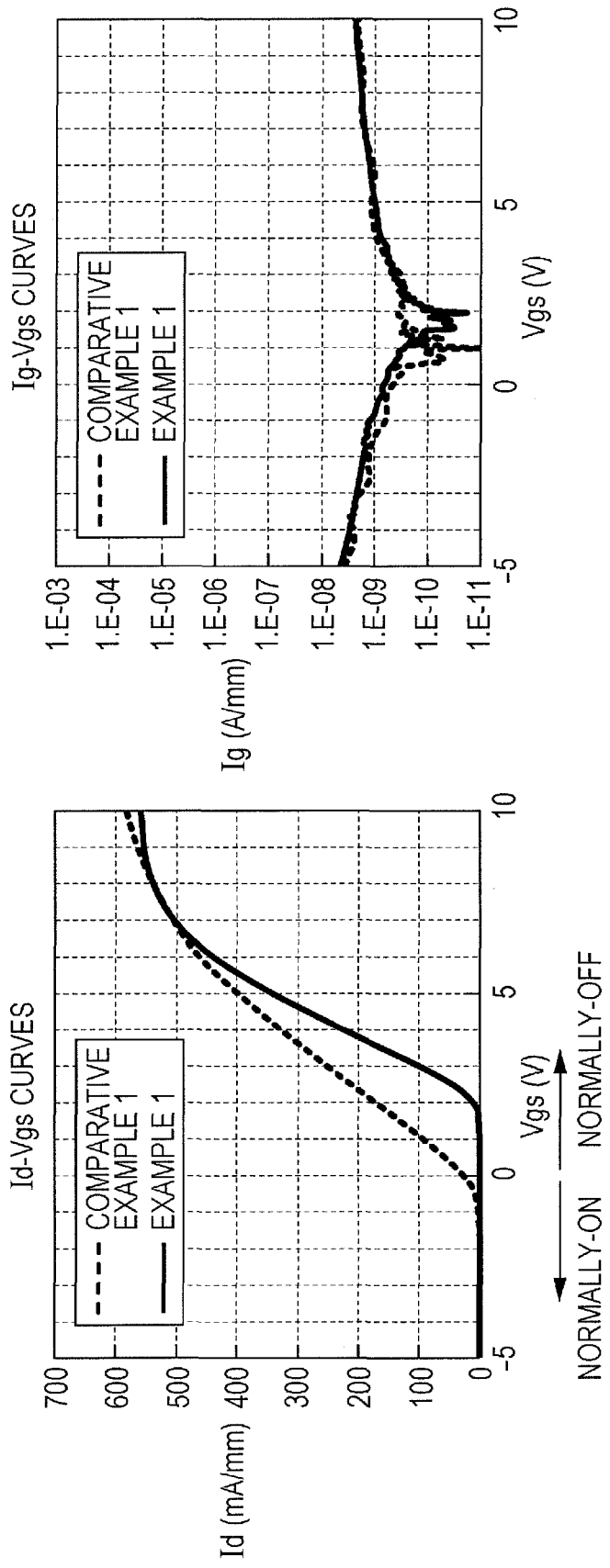
FIGS. 5A and 5B are graphs of certain characteristics of a semiconductor device according to Example 1 and the semiconductor device according to Comparative Example 1.

The electrical characteristics of the semiconductor device according to Example 1, that is, the semiconductor device according to the present embodiment and the semiconductor device according to Comparative Example 1 will be described below with reference to FIGS. 5A and 5B. FIG. 5A is a graph of drain current Id-gate voltage Vgs curves. FIG. 5B is a graph of gate leakage current Ig-gate voltage Vgs curves. The drain current Id is an electric current between the drain and the source. In the semiconductor device according to Comparative Example 1, the drain current slightly remains even at a gate voltage of 0 V, indicating insufficient normally-off operation. In the semiconductor device according to Comparative Example 1, it is difficult to control dry etching during the formation of the gate recess 913a and consequently form the gate recess 913a having a desired depth. This may result in low yields. Furthermore, plasma damage resulting from dry etching in the formation of the gate recess 913a may cause variations in threshold voltage, an increase in gate leakage current, or an increase in electron trapping level. In contrast, the semiconductor device according to Example 1 has a negligible drain current at a gate voltage of 0 V, thus substantially achieving normally-off operation, and also has a low gate leakage current.

Comparative Example 2

Figure 6:
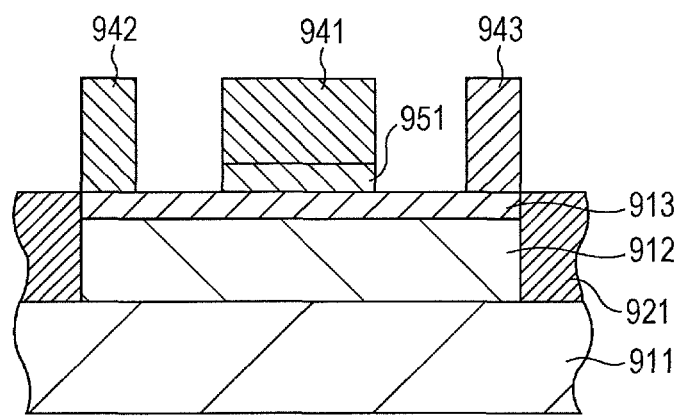
FIG. 6 is a structural drawing of a semiconductor device according to Comparative Example 2.

As illustrated in FIG. 6, a semiconductor device according to Comparative Example 2 is a HEMT having a p-GaN layer under a gate electrode. The semiconductor device according to Comparative Example 2 is manufactured by the following method.

First, an electron transit layer 912, an electron supply layer 913, and a p-GaN layer 951 are sequentially formed as semiconductor layers on a substrate 911 by MOVPE. The electron transit layer 912 is an intentionally undoped GaN layer having a thickness of approximately 3 μm. The electron supply layer 913 is an intentionally undoped $Al_{0.25}Ga_{0.75}N$ having a thickness of approximately 20 nm. The p-GaN layer 951 is a GaN layer having a thickness of 20 nm and is doped with a p-type impurity element Mg at a concentration of approximately $1\times10^{19}$ cm$^{-3}$. A resist pattern having an opening corresponding to a device isolation region 921 is formed on the p-GaN layer 951. The device isolation region 921 is formed on the semiconductor layer by subsequent dry etching with a gas containing a chlorine component or ion implantation.

A resist pattern having openings corresponding to a source electrode 942 and a drain electrode 943 are formed on the p-GaN layer 951. A region of the p-GaN layer 951 not coated with the resist is removed to expose the electron supply layer 913. A Ti/Al layered metal film is then formed, and the metal film on the resist pattern is removed by lift-off to form the source electrode 942 and the drain electrode 943 on the electron supply layer 913. The source electrode 942 and the drain electrode 943 are then heat-treated at a temperature of approximately 700° C. for ohmic contact.

A resist is applied to a region of the p-GaN layer 951 corresponding to a gate electrode 941, and a region of the p-GaN layer 951 not coated with the resist is removed by dry etching, such as RIE. The resist is then removed. A resist pattern having an opening corresponding to the gate electrode 941, that is, on the remaining p-GaN layer 951 is formed. A Ni/Au layered metal film is then formed, and the metal film on the resist pattern is removed by lift-off to produce a laminate of the p-GaN layer 951 and the gate electrode 941 on the electron supply layer 913. A semiconductor device HEMT according to Comparative Example 2 is manufactured through these processes.

Comparison with Comparative Example 2

Figure 7A:
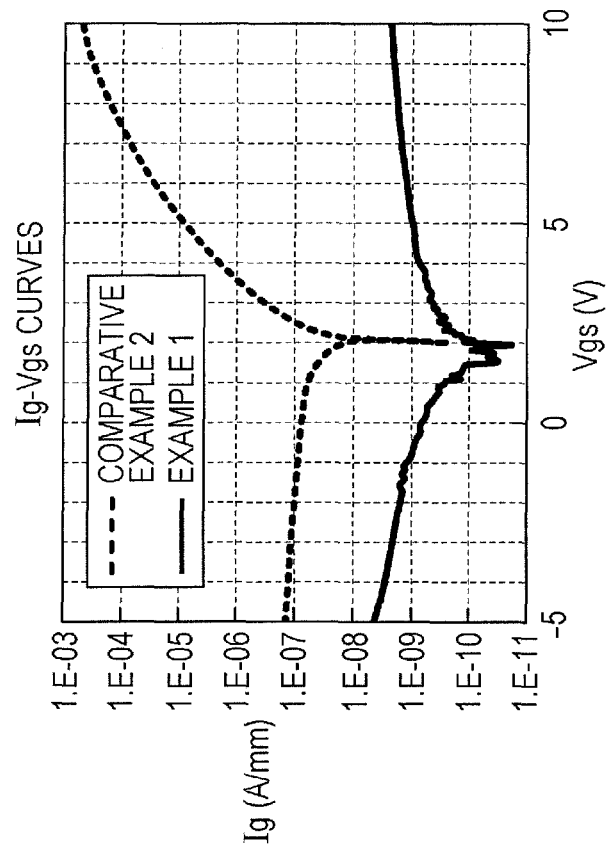
FIGS. 7A and 7B are graphs of certain characteristics of the semiconductor device according to Example 1 and the semiconductor device according to Comparative Example 2.
Figure 7B:
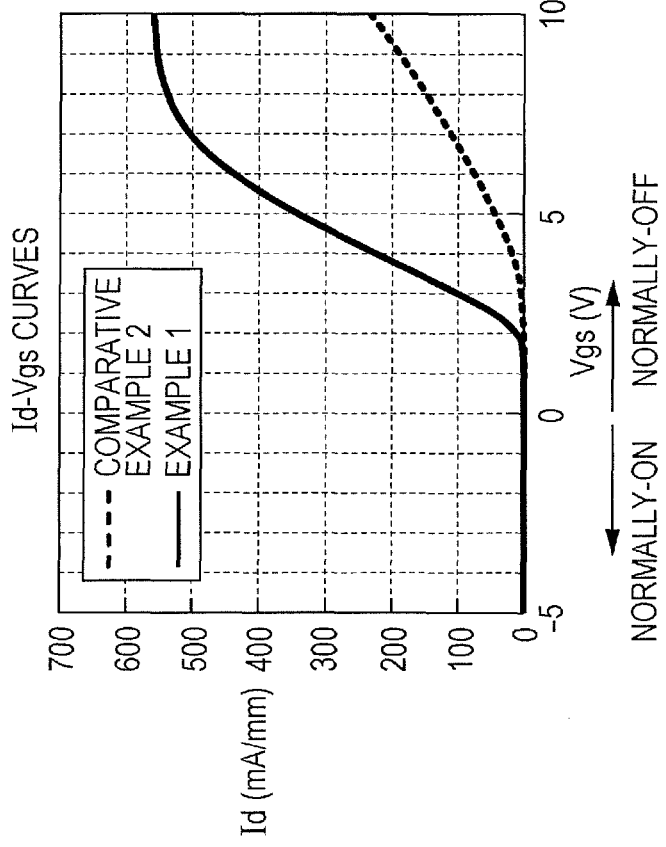

The electrical characteristics of the semiconductor device according to Example 1, that is, the semiconductor device according to the present embodiment and the semiconductor device according to Comparative Example 2 will be described below with reference to FIGS. 7A and 7B. FIG. 7A is a graph of drain current Id-gate voltage Vgs curves. FIG. 7B is a graph of gate leakage current Ig-gate voltage Vgs curves. Although the semiconductor device according to Comparative Example 2 has a negligible drain current at a gate voltage of 0 V and is in a normally-off state, the drain current is low at high gate voltages. The gate leakage current is very high. In the semiconductor device according to Comparative Example 2, it is difficult to etch the p-GaN layer 951 without damaging the electron supply layer 913. Further-more, crystals in the p-GaN layer 951 are also difficult to grow. These may result in low yields. In contrast, the semiconductor device according to Example 1 has a negligible drain current at a gate voltage of 0 V, thus substantially achieving normally-off operation. Furthermore, the drain current is high at positive gate voltages, and the gate leakage current is low.

Comparative Example 3

Figure 8:
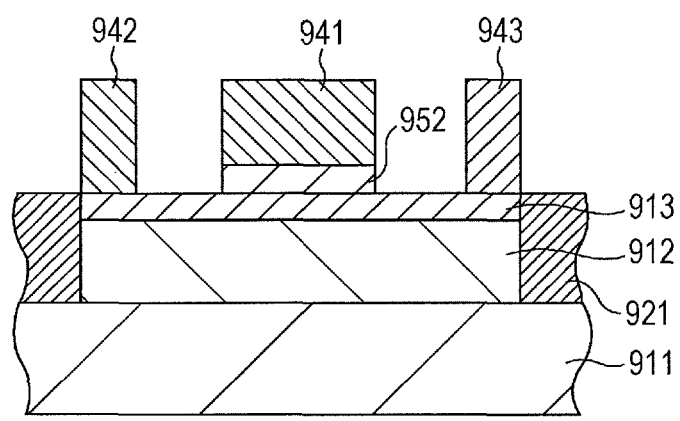
FIG. 8 is a structural drawing of a semiconductor device according to Comparative Example 3.

As illustrated in FIG. 8, a semiconductor device according to Comparative Example 3 is a HEMT having a p-NiO layer under a gate electrode. The semiconductor device according to Comparative Example 3 is manufactured by the following method.

First, an electron transit layer 912 and an electron supply layer 913 are sequentially formed as semiconductor layers on a substrate 911 by MOVPE. The electron transit layer 912 is an intentionally undoped GaN layer having a thickness of approximately 3 μm. The electron supply layer 913 is an intentionally undoped $Al_{0.25}Ga_{0.75}N$ having a thickness of approximately 20 nm. A resist pattern having an opening corresponding to a device isolation region 921 is formed on the electron supply layer 913. The device isolation region 921 is formed on the semiconductor layer by subsequent dry etching with a gas containing a chlorine component or ion implantation.

A resist pattern having openings corresponding to a source electrode 942 and a drain electrode 943 is formed on the electron supply layer 913. After a Ti/Al layered metal film is formed, a portion of the metal film on the resist pattern is removed by lift-off to form the source electrode 942 and the drain electrode 943 on the electron supply layer 913. The source electrode 942 and the drain electrode 943 are then heat-treated at a temperature of approximately 700° C. for ohmic contact.

A NiO film 952 having a thickness of approximately 30 nm is then formed on the electron supply layer 913 by sputtering. A resist is applied to a region of the NiO film 952 corresponding to a gate electrode 941, and a region of the NiO film 952 not coated with the resist is removed by dry etching, such as RIE. The resist is then removed. A resist pattern having an opening corresponding to the gate electrode 941, that is, on the remaining NiO film 952 is formed. A Ni/Au layered metal film is then formed, and the metal film on the resist pattern is removed by lift-off to produce a laminate of the NiO film 952 and the gate electrode 941 on the electron supply layer 913.

A semiconductor device HEMT according to Comparative Example 3 is manufactured through these processes.

Comparison with Comparative Example 3

Figure 9A:
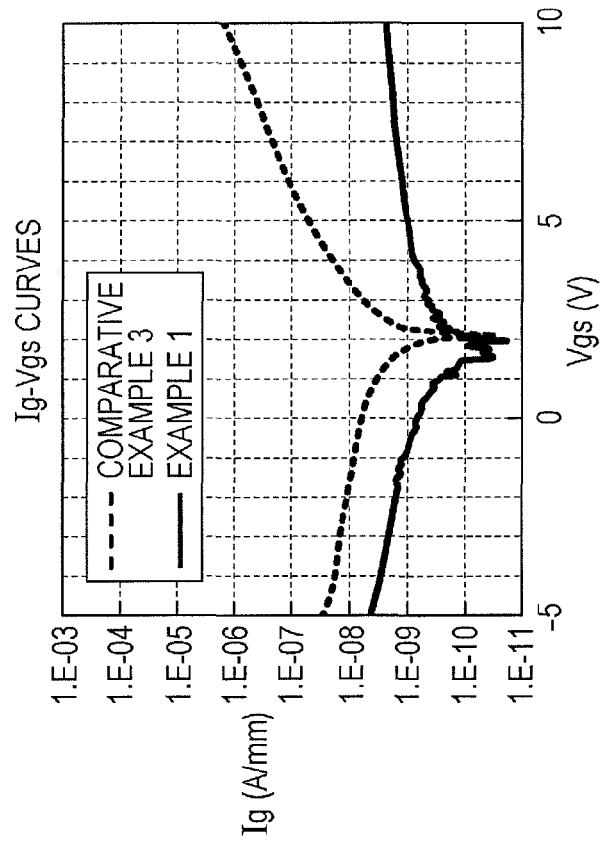
FIGS. 9A and 9B are graphs of certain characteristics of the semiconductor device according to Example 1 and the semiconductor device according to Comparative Example 3.
Figure 9B:
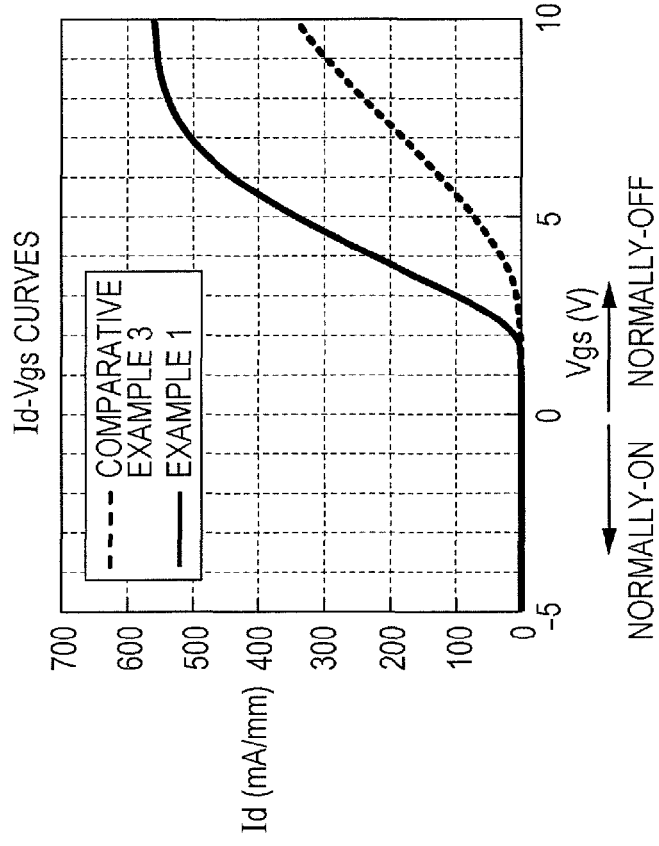

The electrical characteristics of the semiconductor device according to Example 1, that is, the semiconductor device according to the present embodiment and the semiconductor device according to Comparative Example 3 will be described below with reference to FIGS. 9A and 9B. FIG. 9A is a graph of drain current Id-gate voltage Vgs curves. FIG. 9B is a graph of gate leakage current Ig-gate voltage Vgs curves. Although the semiconductor device according to Comparative Example 3 has a negligible drain current at a gate voltage of 0 V and is in a normally-off state, the drain current is low at high gate voltages. Furthermore, the gate leakage current is relatively high. In the semiconductor device according to Comparative Example 3, it is difficult to etch the NiO film 952 without damaging the electron supply layer 913. Furthermore, the NiO film 952 has poor insulation performance and is not adapted for high voltage. In contrast, the semiconductor device according to Example 1 has a negligible drain current at a gate voltage of 0 V, thus substantially achieving normally-off operation. Furthermore, the drain current is high at positive gate voltages, and the gate leakage current is low.

Method for Manufacturing Another Semiconductor Device

In accordance with the method for manufacturing the semiconductor device according to the present embodiment, the first insulating film 31 and the second insulating film 32 are formed on the cap layer 14. The semiconductor device according to the present embodiment may also be manufactured by another method. More specifically, a lower insulating film may be formed on the cap layer 14, and a portion of the lower insulating film under a region for forming a gate electrode 41 may be removed.

Figure 10A:
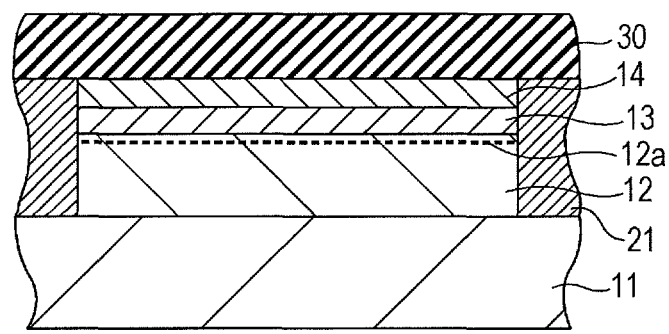
FIGS. 10A and 10B are explanatory views of the method for manufacturing another semiconductor device according to the first embodiment.

More specifically, after the process illustrated in FIG. 1B, a lower insulating film 30 is formed, as illustrated in FIG. 10A. The lower insulating film 30 is formed with the same material and by the same method as the first insulating film 31 and the second insulating film 32. The lower insulating film 30 has a thickness equal to the total thickness of the first insulating film 31 and the second insulating film 32.

Figure 10B:
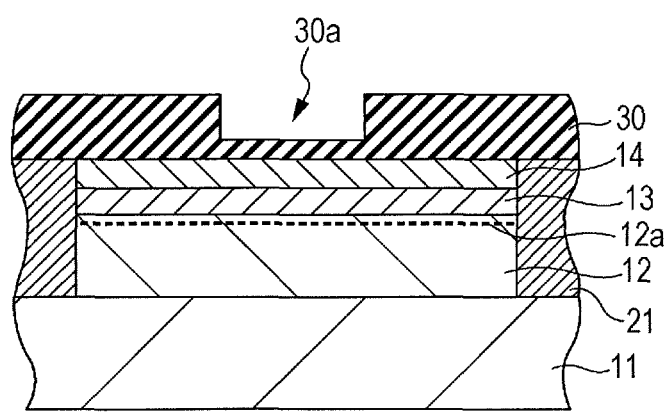

As illustrated in FIG. 10B, a portion of the lower insulating film 30 under the region for forming the gate electrode 41 is removed to form the depressed portion 30a in the lower insulating film 30. More specifically, a photoresist is applied to the lower insulating film 30, is exposed to light from an exposure apparatus, and is developed to form a resist pattern (not shown) having an opening corresponding to the depressed portion 30a. The lower insulating film 30 in a region not coated with the resist is removed by dry etching, such as RIE, to a predetermined film thickness. The resist pattern is then removed with an organic solvent. The depressed portion 30a corresponds to the depressed portion 32a in FIG. 2A. The thickness of the lower insulating film 30 under the depressed portion 30a is substantially the same as the thickness of the second insulating film 32. In other words, the depth of the depressed portion 30a is substantially the same as the thickness of the first insulating film 31.

A semiconductor device similar to that illustrated in FIG. 3B may be manufactured by the process illustrated in FIG. 2B and subsequent processes. This method for manufacturing a semiconductor device includes the formation of the lower insulating film 30 only once. Thus, a semiconductor device may be manufactured by a simple process at low cost. Dry etching is performed only in the lower insulating film 30, and the cap layer 14 is not exposed to nor damaged by plasma.

Semiconductor Device Having Recess

Figure 11:
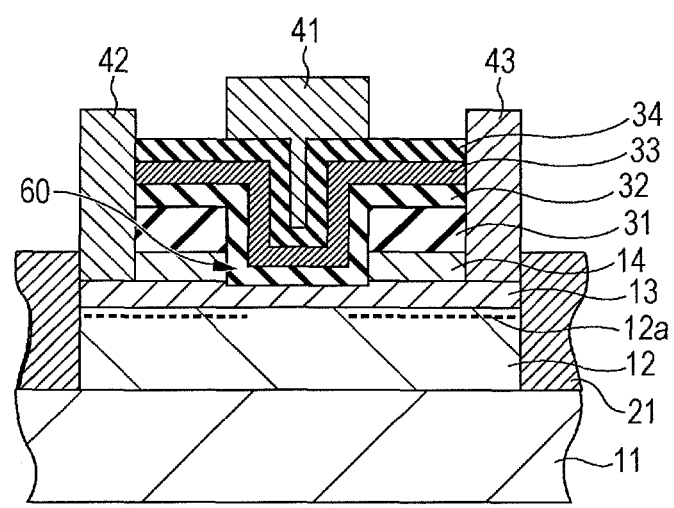
FIG. 11 is an explanatory view of still another semiconductor device according to the first embodiment.

The semiconductor device according to the present embodiment may have a gate recess in a semiconductor layer. More specifically, as illustrated in FIG. 11, the semiconductor device according to the present embodiment may have a gate recess 60 in an electron transit layer 13 and a cap layer 14 under a gate electrode 41. The gate recess 60 facilitates normally-off operation. In the case that the gate recess 60 is formed by dry etching, a region including the gate recess 60 may be damaged by plasma. However, the region damaged by plasma is small. Furthermore, the oxide film 33 under the gate electrode 41 may be close to the electron transit layer 12. This may reduce electrons of 2DEG 12a under the gate electrode 41. Thus, the advantages of the present embodiment outweigh the damage.

Second Embodiment

A method for manufacturing a semiconductor device according to a second embodiment will be described below with reference to FIGS. 12A to 14B.

Figure 12A:
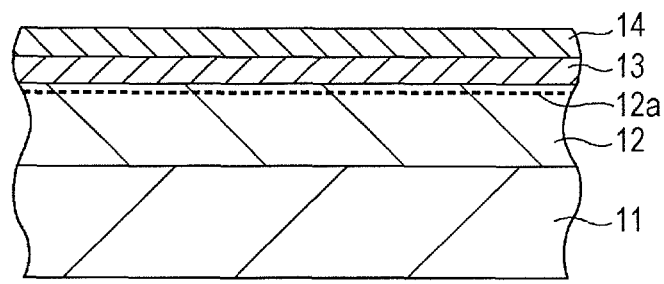
FIGS. 12A to 12C are process drawings (1) of a method for manufacturing a semiconductor device according to a second embodiment.

As illustrated in FIG. 12A, a buffer layer (not shown), an electron transit layer 12, an electron supply layer 13, and a cap layer 14 are sequentially epitaxially grown as semiconductor layers on a substrate 11 by MOVPE.

The substrate 11 may be made of Si, sapphire, SiC, GaN, or AlN.

The electron transit layer 12 is a first semiconductor layer made of intentionally undoped GaN having a thickness of 3 µm.

The electron supply layer 13 is a second semiconductor layer made of intentionally undoped $Al_{0.25}Ga_{0.75}N$ having a thickness of 20 nm. The electron supply layer 13 may be of an n type partly doped with an impurity element, such as Si.

The cap layer 14 is a third semiconductor layer and is made of n-GaN doped with an impurity element, such as Si. The cap layer 14 stabilizes the surface of the semiconductor layers and may be an intentionally undoped GaN (i-GaN) or may have a multilayer cap structure of $Al_xGa_{1-x}N$ (the Al ratio x is different from that of AlGaN in the electron supply layer 13). The cap layer 14 may be omitted. 2DEG 12a is formed in the electron transit layer 12 adjacent to the electron supply layer 13.

Figure 12B:
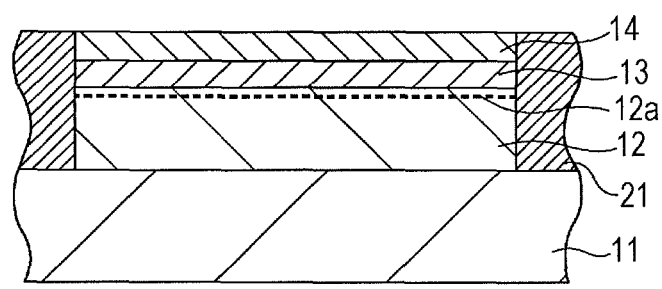

As illustrated in FIG. 12B, a device isolation region 21 is formed in the semiconductor layers. More specifically, a photoresist is applied to the cap layer 14, is exposed to light from an exposure apparatus, and is developed to form a resist pattern (not shown) having an opening corresponding to the device isolation region 21. The device isolation region 21 is formed by subsequent dry etching with a chlorine gas or ion implantation. After the device isolation region 21 is formed, the resist pattern is removed with an organic solvent.

Figure 12C:
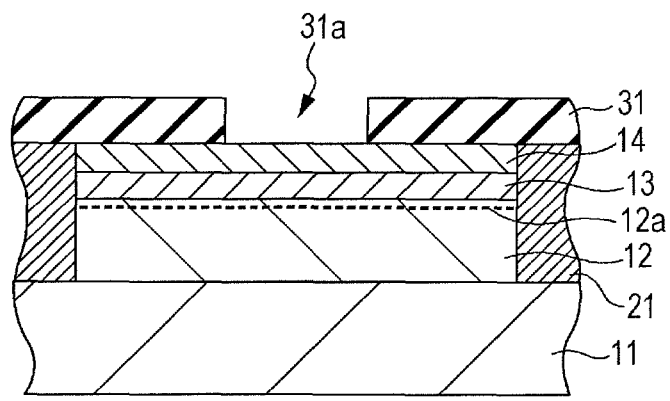

As illustrated in FIG. 12C, the first insulating film 31 is then formed. The first insulating film 31 is made of an insulating oxide or nitride, such as a material containing one or two or more selected from the group consisting of $Al_2O_3$, SiN, $SiO_2$, $HfO_2$, $Ta_2O_5$, $ZrO_2$, and MgO. In the present embodiment, the first insulating film 31 is an $Al_2O_3$ film formed by ALD. In ALD, the raw materials are TMA for Al and water, oxygen plasma, or ozone for oxygen. The first insulating film 31 is preferably formed at a temperature in the range of 200° C. to 600° C. After the first insulating film 31 is formed, a photoresist is applied to the first insulating film 31, is exposed to light from an exposure apparatus, and is developed to form a resist pattern (not shown) having an opening under a region for forming a gate electrode 41 described below. A portion of the first insulating film 31 exposed through the opening of the resist pattern is removed by wet etching to form an opening 31a. Thus, the opening 31a in the first insulating film 31 is disposed under the region for forming the gate electrode 41. The resist pattern (not shown) is then removed with an organic solvent. The removal of the first insulating film 31 by wet etching causes little damage to the cap layer 14.

Figure 13A:
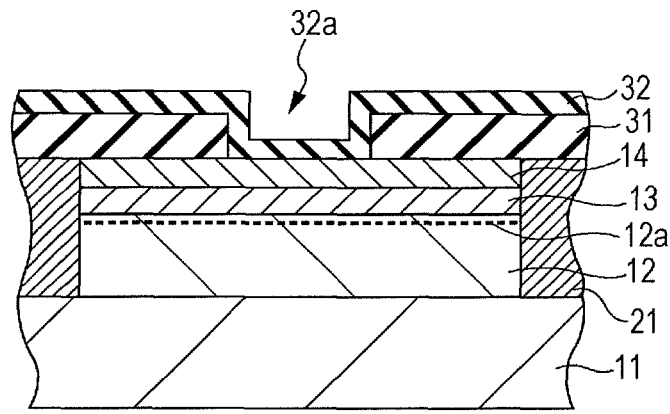
FIGS. 13A to 13C are process drawings (2) of the method for manufacturing the semiconductor device according to the second embodiment.

As illustrated in FIG. 13A, a second insulating film 32 is formed on the first insulating film 31 and the cap layer 14. The second insulating film 32 is made of an insulating oxide or nitride, such as a material containing one or two or more selected from the group consisting of $Al_2O_3$, SiN, $SiO_2$, $HfO_2$, $Ta_2O_5$, $ZrO_2$, and MgO. In the present embodiment, the second insulating film 32 is an $Al_2O_3$ film formed by ALD. In ALD, the raw materials are TMA for Al and water, oxygen plasma, or ozone for oxygen. The second insulating film 32 is preferably formed at a temperature in the range of 200° C. to 600° C.

The formation of the first insulating film 31 and the second insulating film 32 may be followed by heat treatment preferably at a temperature in the range of 350° C. to 1000° C. The first insulating film 31 and the second insulating film 32 may also be formed by plasma CVD or sputtering. In the present embodiment, the first insulating film 31 and the second insulating film 32 may also be referred to as a lower insulating film. Thus, a depressed portion 32a is formed on the lower insulating film composed of the first insulating film 31 and the second insulating film 32 under the region for forming the gate electrode 41.

Figure 13B:
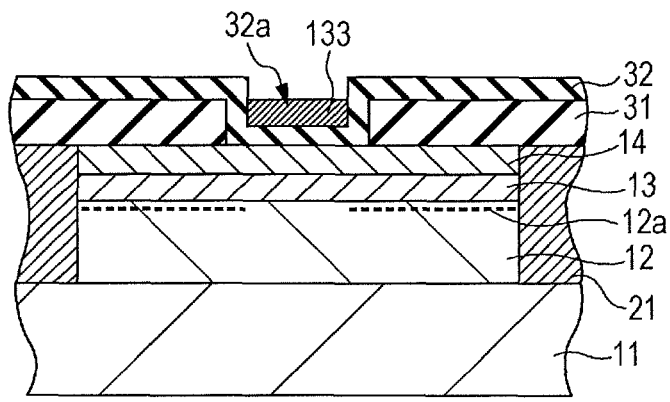

As illustrated in FIG. 13B, an oxide film 133 is formed in the depressed portion 32a of the second insulating film 32, that is, on the second insulating film 32 on top of the opening 31a of the first insulating film 31. More specifically, an oxide film for the oxide film 133 is formed on the second insulating film 32. A photoresist is applied to the oxide film, is exposed to light from an exposure apparatus, and is developed to form a resist pattern (not shown) corresponding to the oxide film 133. A portion of the oxide film not coated with the resist is removed by RIE to form the oxide film 133. The resist pattern is then removed with an organic solvent. The oxide film 133 is made of a p-type electroconductive oxide, or more specifically, a material containing one or two or more selected from the group consisting of NiO, $Cu_2O$, $CuAlO_2$, $Ga_2O_3$, and $CuGaO_2$. Although these oxides have p-type electrical conductivity without an impurity element, these oxides may be doped with a p-type impurity element to produce better effects. The oxide film 133 is a NiO film having a thickness of 40 nm formed by sputtering. The oxide film 133 may also be formed by vacuum evaporation. The oxide film 133 may be heat-treated at a temperature in the range of 300° C. to 1000° C. in an oxygen or nitrogen atmosphere.

Figure 13C:
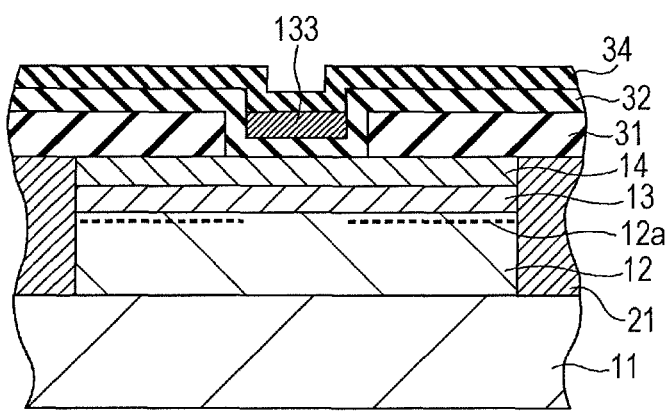

As illustrated in FIG. 13C, a third insulating film 34 is formed on the oxide film 133 and the second insulating film 32. The third insulating film 34 is made of an insulating nitrogen-containing material, or more specifically, a nitride, such as SiN or AlN, or an oxynitride, such as SiON or AlON. In the present embodiment, the third insulating film 34 is a SiN film having a thickness of 5 nm formed by plasma CVD. It is noted that the third insulating film 34 contains nitrogen.

Figure 14A:
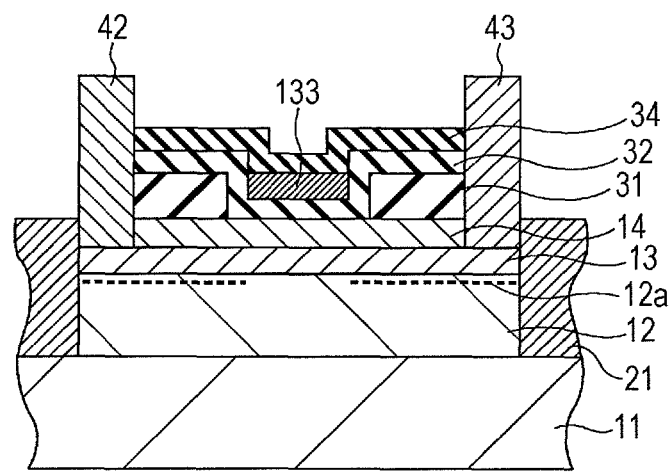
FIGS. 14A and 14B are process drawings (3) of the method for manufacturing the semiconductor device according to the second embodiment.

As illustrated in FIG. 14A, a source electrode 42 and a drain electrode 43 are formed in contact with the semiconductor layers. More specifically, a photoresist is applied to the third insulating film 34, is exposed to light from an exposure apparatus, and is developed to form a resist pattern (not shown) having openings corresponding to the source electrode 42 and the drain electrode 43. The third insulating film 34, the second insulating film 32, the first insulating film 31, and the cap layer 14 are partly removed by dry etching, such as RIE with a gas containing a chlorine component, to expose the electron supply layer 13. After the resist pattern is removed, a photoresist is again applied to the third insulating film 34, is exposed to light from an exposure apparatus, and is developed to form a resist pattern (not shown) having openings corresponding to the source electrode 42 and the drain electrode 43. A Ta/Al/Ta layered metal film is then formed by vacuum evaporation and is immersed in an organic solvent to lift-off the metal film on the resist pattern. Thus, the source electrode 42 and the drain electrode 43 made of Ta/Al/Ta are formed on the electron supply layer 13 in a region not coated with the resist. The source electrode 42 and the drain electrode 43 are then heat-treated at a temperature of 600° C. or less for ohmic contact.

Figure 14B:
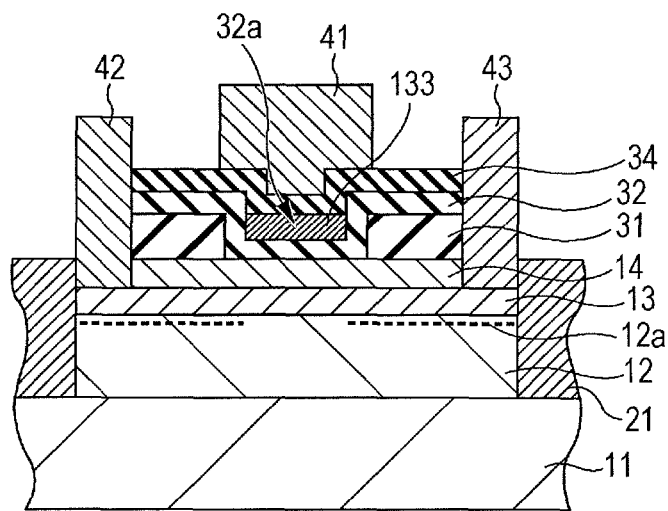

As illustrated in FIG. 14B, the gate electrode 41 is formed on the third insulating film 34. More specifically, a photoresist is applied to the third insulating film 34, is exposed to light from an exposure apparatus, and is developed to form a resist pattern (not shown) having an opening corresponding to the region for forming the gate electrode 41, that is, the depressed portion 32a under the third insulating film 34. A Ni/Au layered metal film is then formed by vacuum evaporation and is immersed in an organic solvent to lift-off the metal film on the resist pattern. Thus, the gate electrode 41 made of Ni/Au is formed on the third insulating film 34 in a predetermined region not coated with the resist. In this manner, the gate electrode 41 is disposed on the third insulating film 34 on top of the oxide film 133.

In this way, the semiconductor device according to the present embodiment may be manufactured. The present embodiment does not include a process of exposing the semiconductor layers, such as the cap layer 14, to plasma by dry etching and may therefore stably manufacture a semiconductor device having desired characteristics in high yield.

As illustrated in FIG. 14B, the semiconductor device according to the present embodiment includes the p-type electroconductive oxide film 133 only under the gate electrode 41, which allows electrons of the 2DEG 12a only under the oxide film 133 to be reduced. Thus, electrons of the 2DEG 12a only under the gate electrode 41 may be reduced. This may cause normally-off operation. The second insulating film 32 between the oxide film 133 and the cap layer 14 and the third insulating film 34 containing a nitrogen component between the oxide film 133 and the gate electrode 41 may reduce gate leakage current, protect the oxide film, and reduce the electron trapping level. Other details are as described in the first embodiment.

Third Embodiment

A method for manufacturing a semiconductor device according to a third embodiment will be described below with reference to FIGS. 15A to 17B.

Figure 15A:
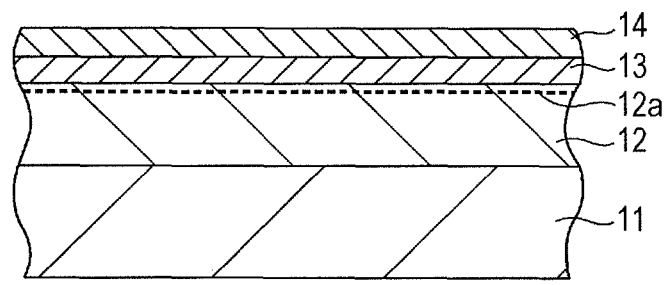
FIGS. 15A to 15C are process drawings (1) of a method for manufacturing a semiconductor device according to a third embodiment.

First, as illustrated in FIG. 15A, a buffer layer (not shown), an electron transit layer 12, an electron supply layer 13, and a cap layer 14 are epitaxially grown as semiconductor layers on a substrate 11 by MOVPE.

The substrate 11 may be made of Si, sapphire, SiC, GaN, or AlN.

The electron transit layer 12 is a first semiconductor layer made of intentionally undoped GaN having a thickness of 3 µm.

The electron supply layer 13 is a second semiconductor layer made of intentionally undoped $Al_{0.25}Ga_{0.75}N$ having a thickness of 20 nm. The electron supply layer 13 may be of an n type partly doped with an impurity element, such as Si.

The cap layer 14 is a third semiconductor layer and is made of n-GaN doped with an impurity element, such as Si. The cap layer 14 stabilizes the surface of the semiconductor layers and may be an intentionally undoped GaN (i-GaN) or may have a multilayer cap structure of $Al_xGa_{1-x}N$ (the Al ratio x is different from that of AlGaN in the electron supply layer 13). The cap layer 14 may be omitted. 2DEG 12a is formed in the electron transit layer 12 adjacent to the electron supply layer 13.

Figure 15B:
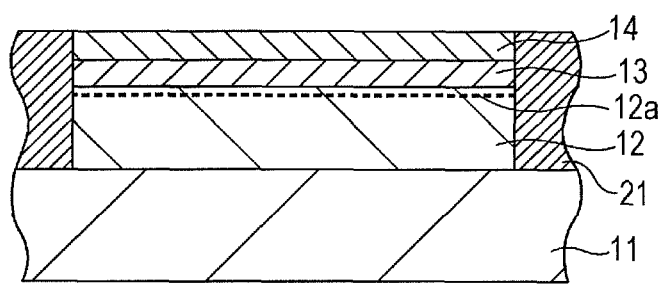

As illustrated in FIG. 15B, a device isolation region 21 is formed in the semiconductor layers. More specifically, a photoresist is applied to the cap layer 14, is exposed to light from an exposure apparatus, and is developed to form a resist pattern (not shown) having an opening corresponding to the device isolation region 21. The device isolation region 21 is formed by subsequent dry etching with a chlorine gas or ion implantation. After the device isolation region 21 is formed, the resist pattern is removed with an organic solvent.

Figure 15C:
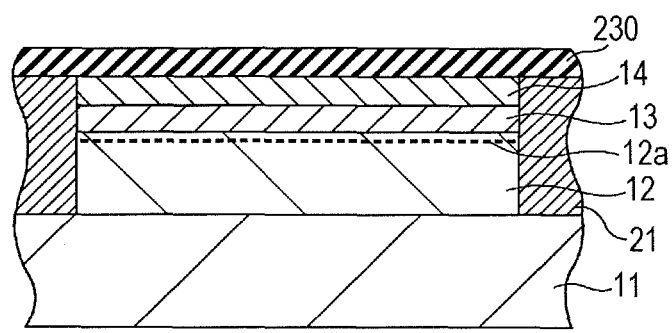

As illustrated in FIG. 15C, a lower insulating film 230 is formed. The lower insulating film 230 is made of an insulating oxide or nitride, such as a material containing one or two or more selected from the group consisting of $Al_2O_3$, SiN, $SiO_2$, $HfO_2$, $Ta_2O_5$, $ZrO_2$, and MgO. In the present embodiment, the lower insulating film 230 is an $Al_2O_3$ film formed by ALD. In ALD, the raw materials are TMA for Al and water, oxygen plasma, or ozone for oxygen. The lower insulating film 230 is preferably formed at a temperature in the range of 200° C. to 600° C.

The formation of the lower insulating film 230 may be followed by heat treatment preferably at a temperature in the range of 350° C. to 1000° C. The lower insulating film 230 may also be formed by plasma CVD or sputtering.

Figure 16A:
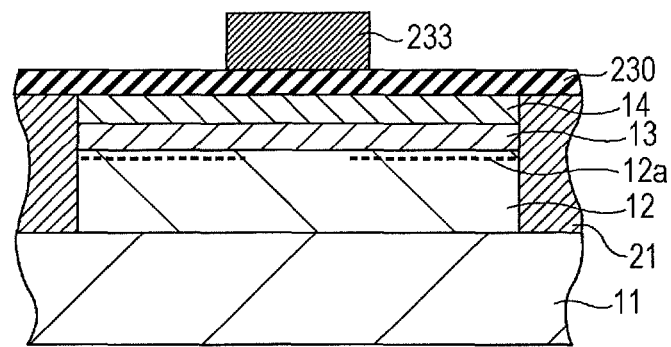
FIGS. 16A and 16B are process drawings (2) of the method for manufacturing the semiconductor device according to the third embodiment.

As illustrated in FIG. 16A, an oxide film 233 is formed on the lower insulating film 230 under a region for forming a gate electrode 41. More specifically, an oxide film for the oxide film 233 is formed on the lower insulating film 230. A photoresist is applied to the oxide film, is exposed to light from an exposure apparatus, and is developed to form a resist pattern (not shown) corresponding to the gate electrode 41. A portion of the oxide film not coated with the resist is removed by RIE to form the oxide film 233. The resist pattern is then removed with an organic solvent. The oxide film 233 is made of a p-type electroconductive oxide, or more specifically, a material containing one or two or more selected from the group consisting of NiO, $Cu_2O$, $CuAlO_2$, $Ga_2O_3$, and $CuGaO_2$. Although these oxides have p-type electrical conductivity without an impurity element, these oxides may be doped with a p-type impurity element to produce better effects. The oxide film 233 is a NiO layer having a thickness of 40 nm formed by sputtering. The oxide film 233 may also be formed by vacuum evaporation. The oxide film 233 may be heat-treated at a temperature in the range of 300° C. to 1000° C. in an oxygen or nitrogen atmosphere.

Figure 16B:
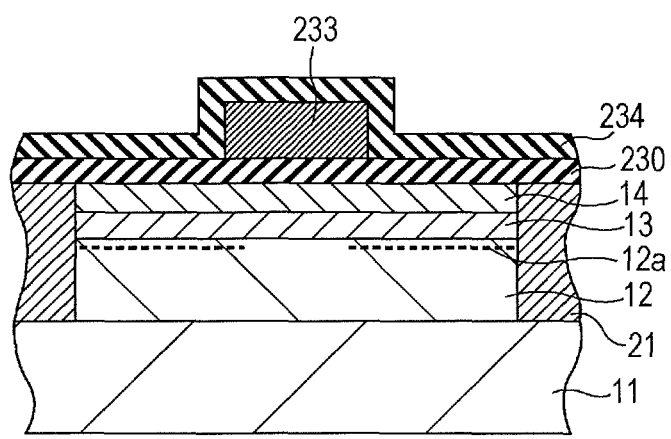

As illustrated in FIG. 16B, an upper insulating film 234 is formed on the oxide film 233 and the lower insulating film 230. The upper insulating film 234 is made of an insulating nitrogen-containing material, or more specifically, a nitride, such as SiN or AlN, or an oxynitride, such as SiON or AlON. In the present embodiment, the upper insulating film 234 is a SiN layer having a thickness of 5 nm formed by plasma CVD. It is noted that the upper insulating film 234 contains nitrogen.

Figure 17A:
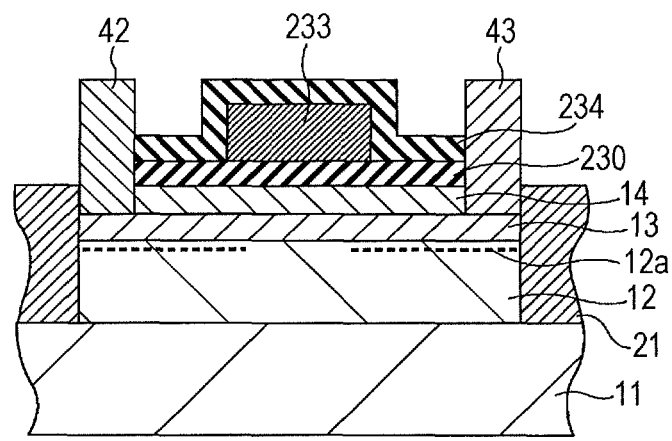
FIGS. 17A and 17B are process drawings (3) of the method for manufacturing the semiconductor device according to the third embodiment.

As illustrated in FIG. 17A, a source electrode 42 and a drain electrode 43 are formed in contact with the semiconductor layers. More specifically, a photoresist is applied to the upper insulating film 234, is exposed to light from an exposure apparatus, and is developed to form a resist pattern (not shown) having openings corresponding to the source electrode 42 and the drain electrode 43. The upper insulating film 234, the lower insulating film 230, and the cap layer 14 are partly removed by dry etching, such as RIE with a gas containing a chlorine component, to expose the electron supply layer 13. After the resist pattern is removed, a photoresist is again applied to the upper insulating film 234, is exposed to light from an exposure apparatus, and is developed to form a resist pattern (not shown) having openings corresponding to the source electrode 42 and the drain electrode 43. A Ta/Al/Ta layered metal film is then formed by vacuum evaporation and is immersed in an organic solvent to lift-off the metal film on the resist pattern. Thus, the source electrode 42 and the drain electrode 43 made of Ta/Al/Ta are formed on the electron supply layer 13 in a region not coated with the resist. The source electrode 42 and the drain electrode 43 are then heat-treated at a temperature of 600° C. or less for ohmic contact.

Figure 17B:
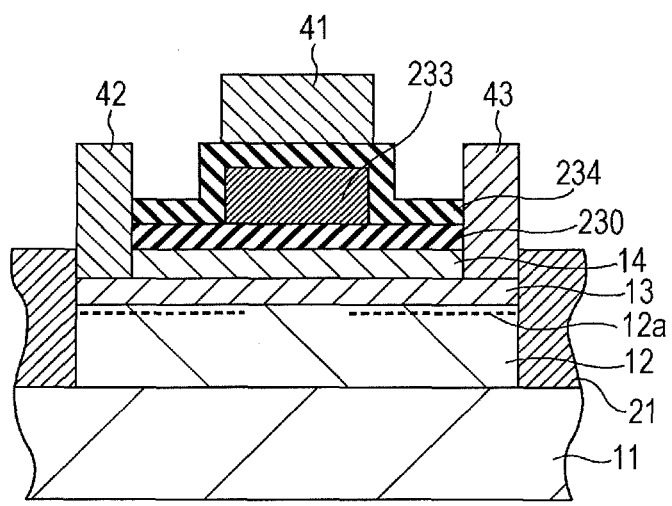

As illustrated in FIG. 17B, the gate electrode 41 is formed on the upper insulating film 234. More specifically, a photoresist is applied to the upper insulating film 234, is exposed to light from an exposure apparatus, and is developed to form a resist pattern (not shown) having an opening corresponding to the region for forming the gate electrode 41, that is, the oxide film 233 under the upper insulating film 234. A Ni/Au layered metal film is then formed by vacuum evaporation and is immersed in an organic solvent to lift-off the metal film on the resist pattern. Thus, the gate electrode 41 made of Ni/Au is formed on the upper insulating film 234 in a predetermined region not coated with the resist. In this manner, the gate electrode 41 is disposed on the upper insulating film 234 on top of the oxide film 233.

In this way, the semiconductor device according to the present embodiment may be manufactured. The present embodiment does not include a process of exposing the semiconductor layers, such as the cap layer 14, to plasma by dry etching and may therefore stably manufacture a semiconductor device having desired characteristics in high yield.

As illustrated in FIG. 17B, the semiconductor device according to the present embodiment includes the p-type electroconductive oxide film 233 only under the gate electrode 41, which allows electrons of the 2DEG 12a only under the oxide film 233 to be reduced. Thus, electrons of the 2DEG 12a only under the gate electrode 41 may be reduced. This may cause normally-off operation. The lower insulating film 230 between the oxide film 233 and the cap layer 14 and the upper insulating film 234 containing a nitrogen component between the oxide film 233 and the gate electrode 41 may reduce gate leakage current, protect the oxide film, and reduce the electron trapping level. Other details are as described in the first embodiment.

Fourth Embodiment

A fourth embodiment will be described below. The present embodiment includes a semiconductor device, a power supply, and a high-frequency amplifier.

Figure 18:
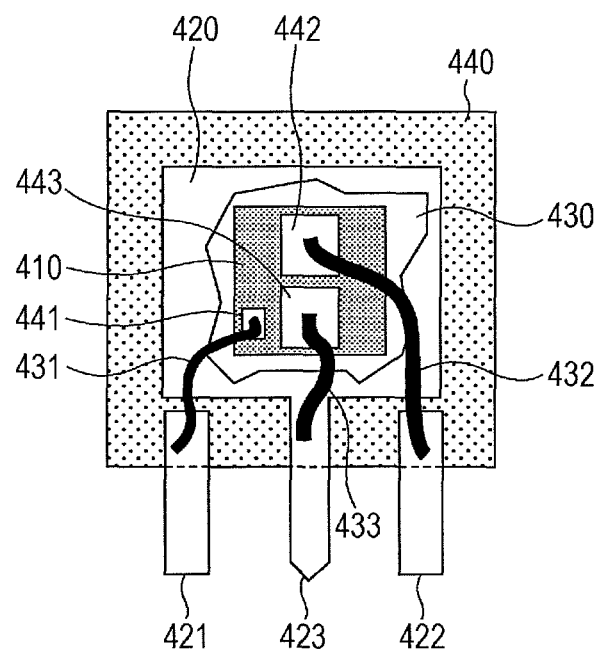
FIG. 18 is an explanatory view of a discrete package of a semiconductor device according to a fourth embodiment.

As illustrated in FIG. 18, the semiconductor device according to the present embodiment includes a discrete package of a semiconductor device according to any one of the first to third embodiments. FIG. 18 is a schematic view of the interior of the discrete package of the semiconductor device. The arrangements of electrodes are different from those in the first to third embodiments.

First, a semiconductor device according to any one of the first to third embodiments is cut into semiconductor chips 410 by dicing. The semiconductor chips 410 are HEMTs made of a GaN semiconductor material. One of the semiconductor chips 410 is fixed to a lead frame 420 with a die attach agent 430, such as solder. The semiconductor chip 410 is a semiconductor device according to any one of the first to third embodiments.

A gate electrode 441 is connected to a gate lead 421 with a bonding wire 431. A source electrode 442 is connected to a source lead 422 with a bonding wire 432. A drain electrode 443 is connected to a drain lead 423 with a bonding wire 433. The bonding wires 431, 432, and 433 are made of a metallic material, such as Al. The gate electrode 441 is a gate electrode pad and is connected to the gate electrode 41 of a semiconductor device according to any one of the first to third embodiments. The source electrode 442 is a source electrode pad and is connected to the source electrode 42 of a semiconductor device according to any one of the first to third embodiments. The drain electrode 443 is a drain electrode pad and is connected to the drain electrode 43 of a semiconductor device according to any one of the first to third embodiments.

The semiconductor device is sealed with a molding resin 440 by transfer molding. In this manner, a discrete package of a semiconductor device that includes a HEMT made of a GaN semiconductor material may be manufactured.

A power supply and a high-frequency amplifier according to the present embodiment will be described below. The power supply and the high-frequency amplifier according to the present embodiment include a semiconductor device according to any one of the first to third embodiments.

Figure 19:
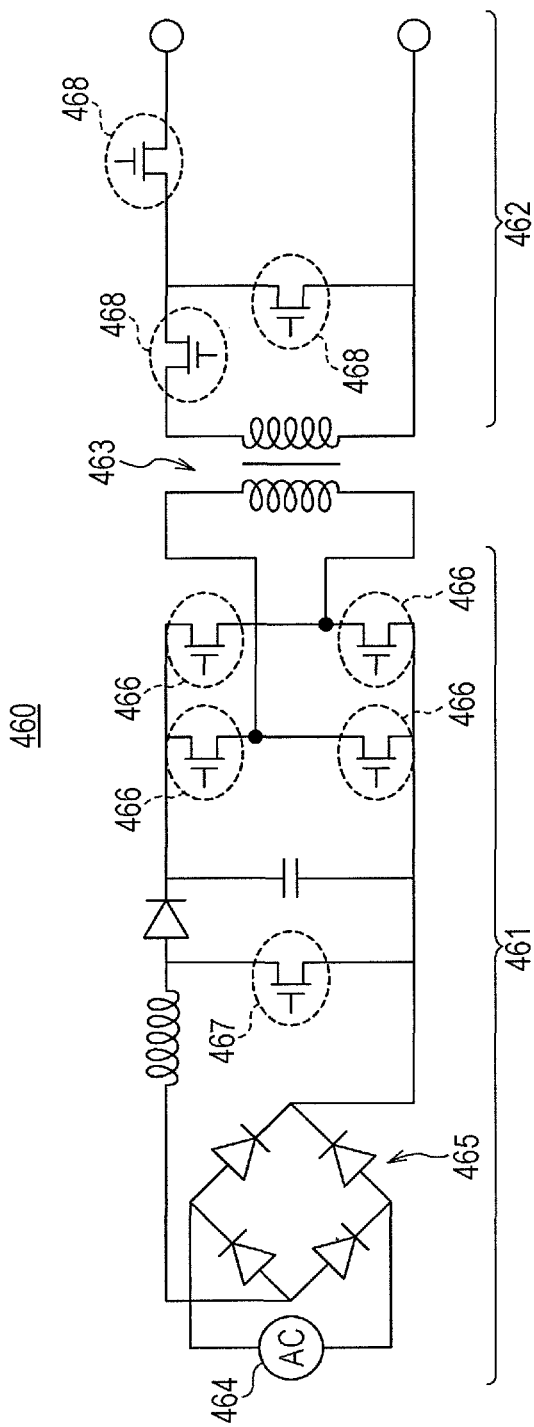
FIG. 19 is a circuit diagram of a power supply according to the fourth embodiment.

The power supply according to the present embodiment will be described below with reference to FIG. 19. A power supply 460 according to the present embodiment includes a high-voltage primary circuit 461, a low-voltage secondary circuit 462, and a transformer 463 disposed between the primary circuit 461 and the secondary circuit 462. The primary circuit 461 includes an alternator 464, a bridge rectifier circuit 465, a plurality of switching devices 466 (four in FIG. 19), and a switching device 467. The secondary circuit 462 includes a plurality of switching devices 468 (three in FIG. 19). Each of the switching devices 466 and 467 in the primary circuit 461 is a semiconductor device according to any one of the first to third embodiments. The switching devices 466 and 467 in the primary circuit 461 are preferably normally-off semiconductor devices. The switching devices 468 in the secondary circuit 462 are common silicon metal-insulator-semiconductor field-effect transistors (MISFETs).

Figure 20:
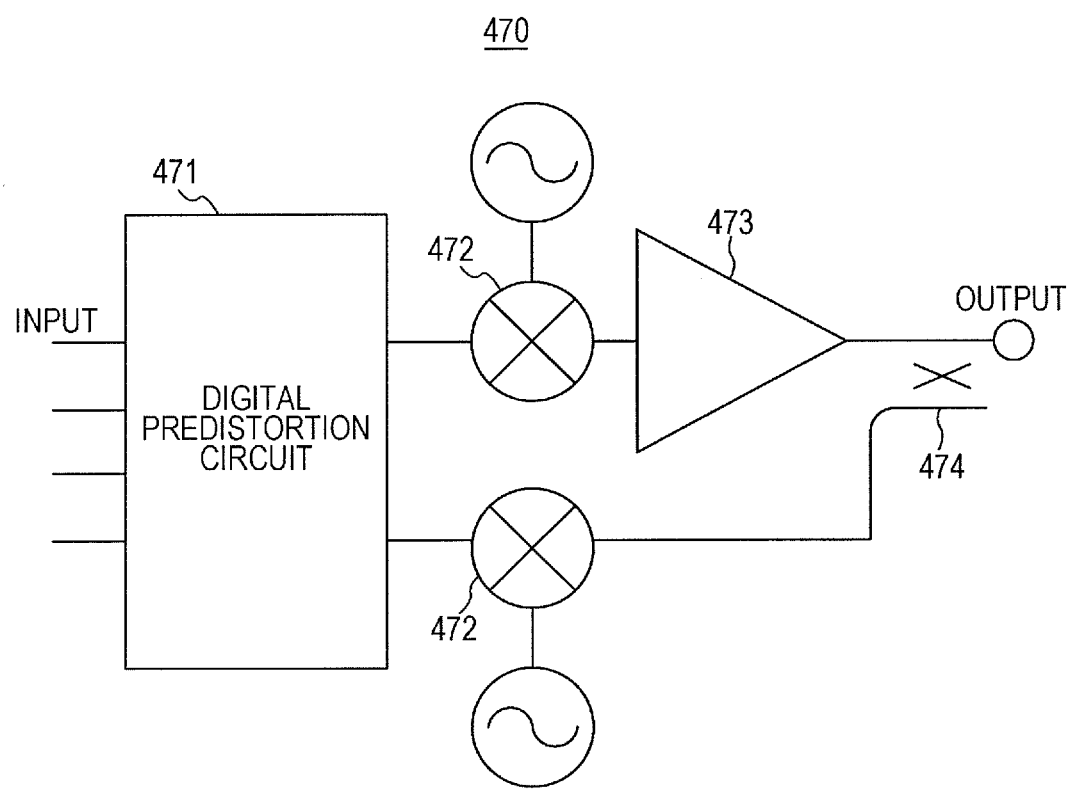
FIG. 20 is a structural drawing of a high-power amplifier according to the fourth embodiment.

The high-frequency amplifier according to the present embodiment will be described below with reference to FIG. 20. A high-frequency amplifier 470 according to the present embodiment may be applied to a base station power amplifier for mobile phones. The high-frequency amplifier 470 includes a digital predistortion circuit 471, mixers 472, a power amplifier 473, and a directional coupler 474. The digital predistortion circuit 471 compensates for the nonlinear strain of an input signal. The mixers 472 mix the compensated input signal with an alternating current signal. The power amplifier 473 amplifies the input signal mixed with the alternating current signal. The power amplifier 473 includes a semiconductor device according to any one of the first to third embodiments. The directional coupler 474 monitors input and output signals. An output signal mixed with an alternating current signal in the mixers 472 may be sent to the digital predistortion circuit 471, for example, by switching.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
a first semiconductor layer formed over a substrate;
a second semiconductor layer formed over the first semiconductor layer;
a source electrode and a drain electrode formed over the second semiconductor layer;
a lower insulating film formed over the second semiconductor layer between the source electrode and the drain electrode;
a recess formed in the lower insulating film;
a p-type electroconductive oxide film formed over the lower insulating film;
an upper insulating film formed over the p-type electroconductive oxide film between the source electrode and the drain electrode;
the upper insulating film is in contact with the source electrode and the drain electrode; and
a gate electrode formed on the upper insulating film,
wherein the recess in the lower insulating film is formed under a region where the gate electrode is formed.

2. The semiconductor device according to claim 1, wherein the p-type electroconductive oxide film is formed in the recess in the lower insulating film, and
the lower insulating film except the recess is in contact with the upper insulating film.

3. The semiconductor device according to claim 1, wherein the lower insulating film includes a first insulating film having an opening corresponding to the depressed portion and a second insulating film disposed on the opening and the first insulating film.

4. The semiconductor device according to claim 1, wherein the upper insulating film is made of an insulator containing a nitrogen component.

5. The semiconductor device according to claim 4, wherein the upper insulating film contains one selected from the group consisting of SiN, AlN, SiON, and AlON.

6. The semiconductor device according to claim 1, further comprising a source electrode and a drain electrode each in contact with the second semiconductor layer.

7. The semiconductor device according to claim 1, wherein the lower insulating film is made of a material containing one or two or more selected from the group consisting of $Al_2O_3$, SiN, $SiO_2$, $HfO_2$, $Ta_2O_5$, $ZrO_2$, and MgO.

8. The semiconductor device according to claim 1, wherein the oxide film is made of a material containing one or two or more selected from the group consisting of NiO, $Cu_2O$, $CuAlO_2$, $Ga_2O_3$, and $CuGaO_2$.

9. The semiconductor device according to claim 1, further comprising a third semiconductor layer between the second semiconductor layer and the lower insulating film.

10. The semiconductor device according to claim 1, wherein the first semiconductor layer is made of a material containing GaN.

11. The semiconductor device according to claim 1, wherein the second semiconductor layer is made of a material containing AlGaN.

12. A method for manufacturing a semiconductor device, comprising:
sequentially forming a first semiconductor layer and a second semiconductor layer on a substrate;
forming a lower insulating film having a depressed portion on the second semiconductor layer under a region for forming a gate electrode;
forming a p-type electroconductive oxide film on the lower insulating film;
forming an upper insulating film on the oxide film; and
forming the gate electrode on the upper insulating film.

13. The method for manufacturing semiconductor device according to claim 12, further comprising:
removing the oxide film in the depressed portion of the lower insulating film after the forming the oxide film,
wherein the removing the oxide film is followed by the forming the upper insulating film.

14. The method for manufacturing a semiconductor device according to claim 12, wherein the forming the lower insulating film comprises:
forming a first insulating film having an opening corresponding to the depressed portion, and forming a second insulating film on the opening and the first insulating film.

15. A method for manufacturing semiconductor device, comprising:
sequentially forming a first semiconductor layer and a second semiconductor layer on a substrate;
forming a lower insulating film on the second semiconductor layer;

forming a p-type electroconductive oxide film on the lower insulating film under a region for forming a gate electrode;

forming an upper insulating film on the oxide film and the lower insulating film; and forming the gate electrode on the upper insulating film.

16. The method for manufacturing a semiconductor device according to claim 12, wherein the upper insulating film is made of an insulator containing a nitrogen component.

17. The method for manufacturing a semiconductor device according to claim 12, further comprising forming a source electrode and a drain electrode each in contact with the second semiconductor layer.

18. A power supply, comprising:

a semiconductor device, wherein the semiconductor device includes a first semiconductor layer formed over a substrate;

a second semiconductor layer formed over the first semiconductor layer;

a source electrode and a drain electrode formed over the second semiconductor layer;

a lower insulating film formed over the second semiconductor layer between the source electrode and the drain electrode;

a recess formed in the lower insulating film;

a p-type electroconductive oxide film formed over the lower insulating film;

an upper insulating film formed over the p-type electroconductive oxide film between the source electrode and the drain electrode;

the upper insulating film is in contact with the source electrode and the drain electrode; and a gate electrode formed on the upper insulating film, wherein the recess in the lower insulating film is formed under a region where the gate electrode is formed.

* * * * *